United States Patent

Matsuo

[11] Patent Number: 5,706,843
[45] Date of Patent: Jan. 13, 1998

[54] SUBSTRATE ROTATING DEVICE

[75] Inventor: Manabu Matsuo, Chiba, Japan

[73] Assignee: Canon Kabushiki Kaisha, Tokyo, Japan

[21] Appl. No.: 590,434

[22] Filed: Jan. 23, 1996

[30] Foreign Application Priority Data

Jan. 24, 1995 [JP] Japan ..................... 7-027197
Mar. 2, 1995 [JP] Japan ..................... 7-066686

[51] Int. Cl.⁶ ........................................ B08B 3/02
[52] U.S. Cl. ..................... 134/153; 134/902; 15/302; 248/362; 108/22
[58] Field of Search ............... 108/20, 21, 22; 134/153, 902; 15/302; 269/21; 248/362, 363

[56] References Cited

U.S. PATENT DOCUMENTS

| | | | |
|---|---|---|---|
| 2,076,784 | 4/1937 | Knipp | 108/20 |
| 4,788,994 | 12/1988 | Shinbara | 134/153 X |
| 4,871,417 | 10/1989 | Nishizawa et al. | 134/153 X |
| 5,322,079 | 6/1994 | Fukutomi et al. | 134/153 |
| 5,361,449 | 11/1994 | Akimoto | 15/302 |
| 5,375,291 | 12/1994 | Tateyama et al. | 134/153 X |
| 5,452,905 | 9/1995 | Bohmer et al. | 269/21 X |

FOREIGN PATENT DOCUMENTS 239621  9/1990  Japan ..................... 269/21

Primary Examiner—Peter M. Cuomo
Assistant Examiner—Janet M. Wilkens
Attorney, Agent, or Firm—Fitzpatrick, Cella, Harper & Scinto

[57] ABSTRACT

A substrate rotating device includes a turn table placed horizontally, a substrate supporting member provided on the turn table, for supporting a substrate with respect to a vertical direction and for regulating the position of the outside periphery of the substrate with respect to a horizontal direction, a driving mechanism causing rotation of the turn table, an opening formed in the turn table, and an evacuating mechanism rotatable as a unit with the turn table, for forcibly evacuating a space between the turn table and the substrate through the opening.

2 Claims, 4 Drawing Sheets

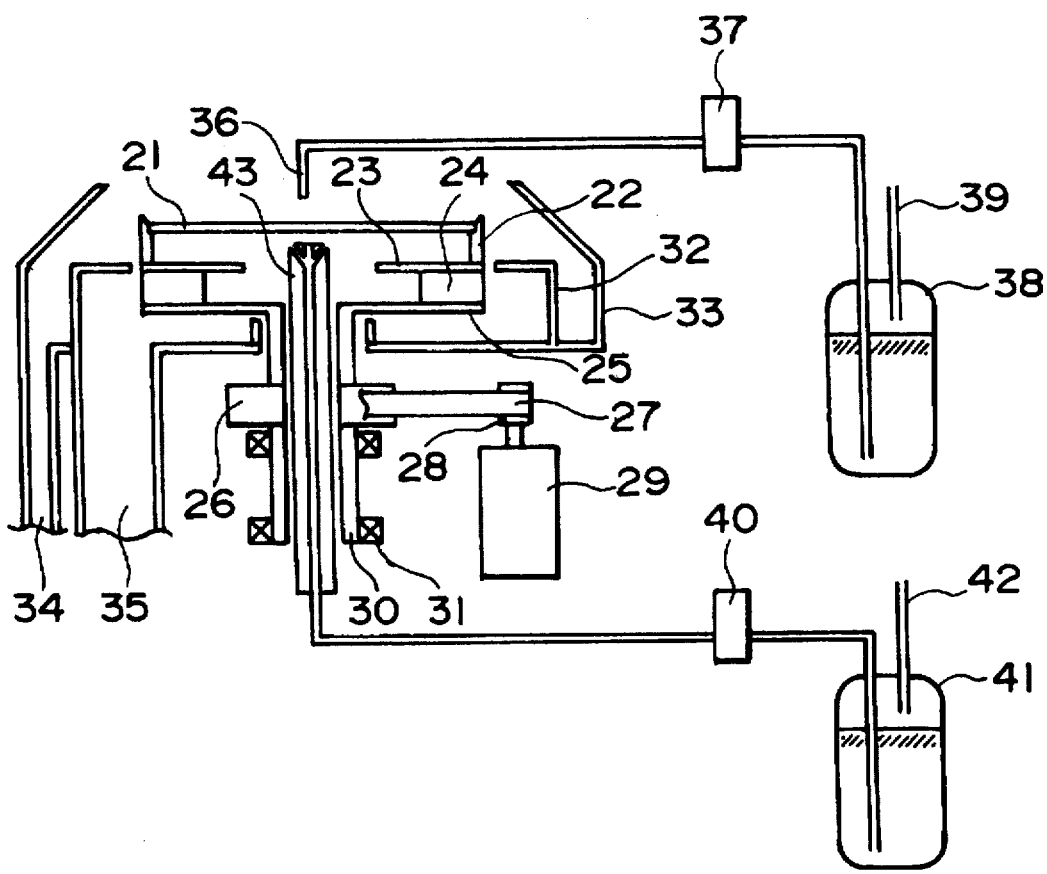
F I G. 3
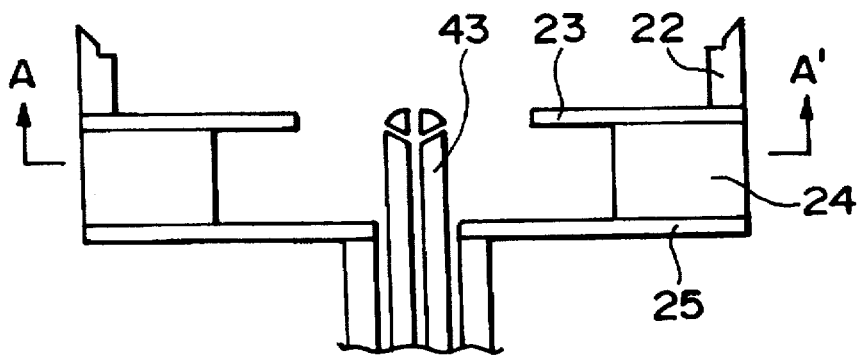
F I G. 4

SUBSTRATE ROTATING DEVICE

FIELD OF THE INVENTION AND RELATED ART

This invention relates to a substrate rotating device for rotating a substrate in atmospheric pressure. In another aspect, the invention relates to a substrate processing apparatus having such a substrate rotating device, for performing a resist coating or developing process to a substrate such as a wafer, for example. More particularly, the invention is concerned with a substrate rotating device or a substrate processing apparatus wherein a negative pressure produced by rotation is applied to stabilization of the substrate.

Conventional substrate rotating devices generally have a mechanism such as shown in FIG 6 wherein a substrate is rotated while the bottom surface of it is attracted through a vacuum pressure. On the other hand, if there is a possibility that the attraction of the bottom surface the substrate causes damage or contamination of that surface, the substrate is rotated while the outside periphery of the substrate is held, as shown in FIG. 7. In these drawings, denoted at 1 is a substrate, and denoted at 2 are substrate holding pins. Denoted at 3 is a turn table, and denoted at 6 is a rotation drive source such as a motor. Denoted at 11 is an attracting plate, and denoted at 12 is a sealing member. Denoted at 13 is a vacuum housing, and denoted at 14 are arrows which show the flow of vacuum.

An example of apparatuses to which such a substrate rotating device as described above is applied is a wafer processing apparatus for performing a resist coating or developing process to a wafer. FIG. 8 shows a conventional wafer processing apparatus wherein a wafer (substrate) 21 is placed on a spinning chuck (attracting plate) 44. The wafer is attracted and held thereby through a negative pressure, and a resist material or a developing liquid is discharged toward the top surface of the wafer which is being rotated (for spreading and coating). Denoted in FIG. 8 at 29 is a motor, and denoted at 33 is a cup. Denoted at 34 is a drain pipe, and denoted at 36 is a nozzle. Denoted at 43 is a rinse nozzle, and denoted at 45 is a vacuum (VAC) line.

SUMMARY OF THE INVENTION

In the conventional mechanisms such as shown in FIGS. 6 and 8, the structure that the bottom surface of a substrate is attracted and held is attributable to damage to or contamination adhesion of particles) of the bottom surface, as described above. Particularly, in the wafer processing apparatus of FIG. 8, temperature uniformness through the whole wafer surface is required for enhanced coating/developing performance. However, because of the bottom surface attraction of a wafer, there is a disadvantage of easy creation of a temperature difference between the attracted portion of the wafer and the non-attracted portion of it.

Further, in the conventional structure of FIG. 7, the substrate is not held fixed with respect to the vertical direction. This leads to problems such as vibration of the substrate during high speed rotation, and a shift of the substrate at the change of the number of revolutions (rubbing of the bottom surface), for example. Thus, the mechanism can be used only in cases where these problems do not arise.

A substrate may be held by using mechanical means. However, it leads to an increase in cost because of the necessity of using a powerful drive source to meet the increase in weight of the rotatable portion, or because of the increase in the number of components of the supporting mechanism.

An object of the present invention is to provide a substrate rotating device for rotating a substrate while holding the outside periphery of it, by which vibration and shift of the substrate are prevented with a simple and inexpensive structure.

It is another object of the present invention to provide a substrate processing apparatus by which a temperature gradient is not easily produced through the whole surface of the substrate and by which contamination is not easily produced.

In accordance with an aspect of the present invention, there is provided a substrate rotating device, comprising: a turn table placed horizontally; a substrate supporting member provided on said turn table, for supporting a substrate with respect to a vertical direction and for regulating the position of the outside periphery of the substrate with respect to a horizontal direction; driving means for causing rotation of said turn table; an opening formed in said turn table; and evacuating means rotatable as a unit with said turn table, for forcibly evacuating a space between said turn table and the substrate through said opening.

In one preferred form of this aspect of the present invention, said evacuating means may include blowing means having (i) a lower plate disposed below said turn table and placed coaxially with and parallel to said turn table, said lower plate having a central shaft connected to said driving means, and (ii) a plurality of blades disposed between said turn table and said lower plate and placed with an angle with respect to a direction of a radius of said turn table, the angle being in a direction opposite to the rotational direction of said turn table, said plurality of blades coupling said turn table with said lower plate as a unit, said blowing means being rotatable integrally with said turn table and said lower plate as the central shaft is driven by said driving means, and wherein said evacuating means may further include a channel-shaped member disposed circumferentially about said blowing means to provide a gas flowpassage and a gas outlet port at an end of said gas flowpassage.

In accordance with another aspect of the present invention, there is provided a substrate processing apparatus, comprising: a turn table placed horizontally; a substrate supporting member provided on said turn table, for supporting a substrate with respect to a vertical direction and for regulating the position of the outside periphery of the substrate with respect to a horizontal direction; driving means for causing rotation of said turn table; a first nozzle for discharging a first liquid medium toward a center of a first surface of the substrate during rotation of said turn table and the substrate; a second nozzle for discharging a second liquid toward a center of a second surface of the substrate during rotation of said turn table and the substrate; an opening formed in said turn table; and evacuating means rotatable as a unit with said turn table, for forcibly evacuating a space between said turn table and the substrate through said opening.

A substrate processing apparatus according to one preferred form of the present invention may have the following features:

(1) It uses a rotatable stage for holding the outside periphery of a wafer with plural pins. The rotatable stage has a fan structure wherein, with rotation, a negative pressure is produced between the wafer and the rotatable stage, for stabilization of the wafer.

(2) A cleaning liquid may be discharged against the bottom surface of the wafer from the center of the rotatable stage. This enables cleaning of the whole bottom surface of the wafer. During the wafer cleaning, the wafer is pressed toward the stage by the negative pressure produced by the rotation. Thus, the holding stability is not damaged by the liquid discharging from below of the wafer bottom surface.

(3) Since the wafer is held at its outside periphery, any temperature gradient to be produced by contact is avoided.

A substrate rotating device according to the present invention has a rotating mechanism which is provided with forcibly evacuating means as a mechanism for producing a negative pressure with rotation. With this arrangement, static pressure contact is produced at the top/bottom surface of the substrate during high speed rotation by which the substrate is pressed toward the rotating mechanism side and by which it is stabilized. This effectively reduces vibration of the substrate during the rotation and shift of the substrate (rubbing of the bottom surface thereof) at the time of change of the number of revolutions.

Additionally, since no movable element is added in the present invention, the structure of the rotating mechanism is simple. Also, the reliability is good and the cost is low.

A substrate processing apparatus according to the present invention provides the same advantageous effects as described above with reference to the substrate rotating device. Additionally, since there is no element which covers the central portion of a substrate, a cleaning liquid can be discharged to the central portion of the bottom surface of the substrate. This enables cleaning of the whole bottom surface of the substrate in a single processing step. Further, since the contact to the bottom surface of the substrate is only at the outside peripheral portion thereof, uniform temperature is assured over wider areas of the top and bottom surfaces of the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic and longitudinal sectional view of a general structure of a substrate processing apparatus, according to another embodiment of the present invention.

FIG. 4 is a sectional view of a rotatable state and a rinse nozzle portion, of the substrate processing apparatus of FIG. 3.

DESCRIPTION OF THE PREFERRED EMBODIMENTS

Figure 1:
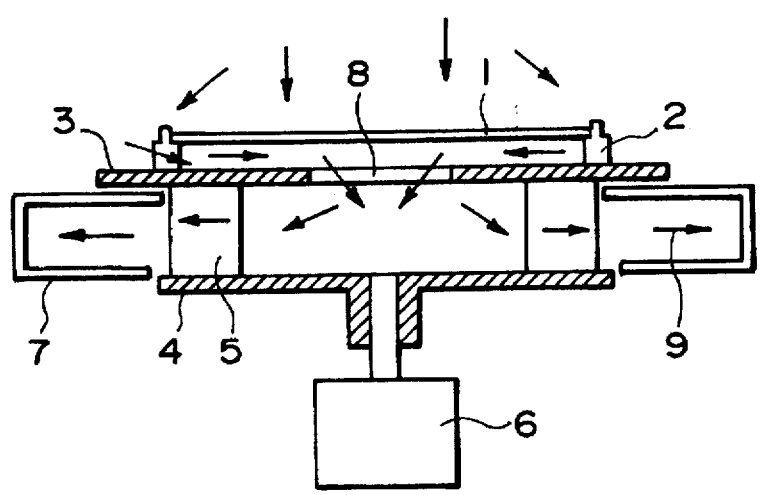
FIG. 1 is a longitudinal sectional view of a substrate rotating portion of a substrate rotating device, according to an embodiment of the present invention.
Figure 2:
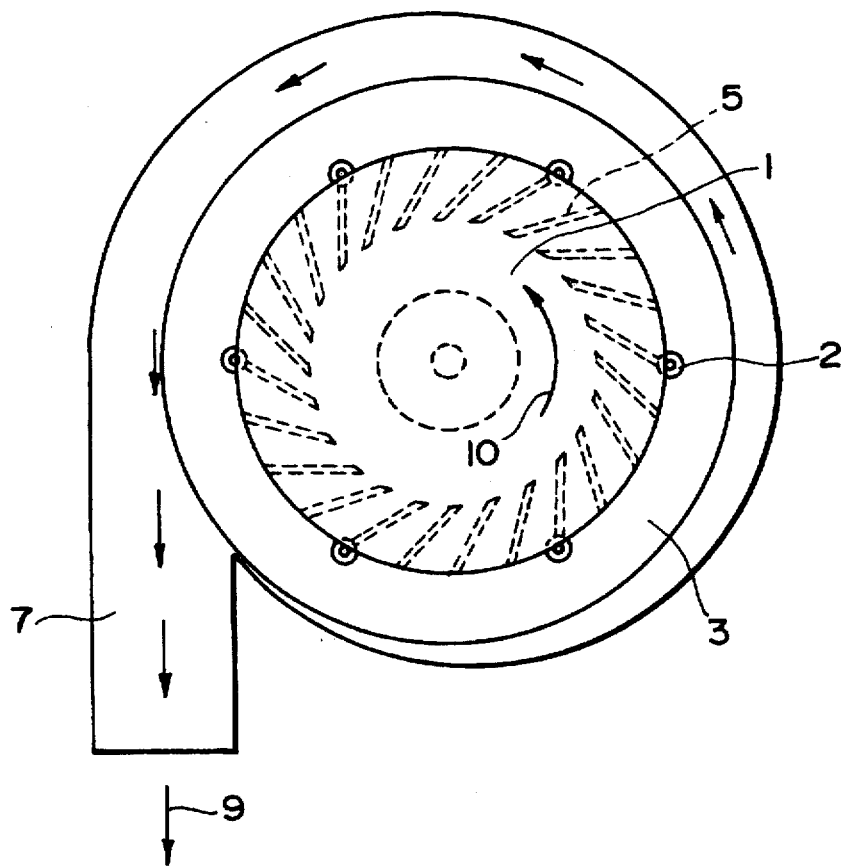
FIG. 2 is a top plan view of the substrate rotating portion of FIG. 1.

FIGS. 1 and 2 show the structure of a substrate rotating device according to an embodiment of the present invention.

FIG. 1 is a longitudinal sectional view, and FIG. 2 is a top plan view. In these drawings, denoted at 1 is a substrate, and denoted at 2 are a plurality of substrate supporting pins for supporting the substrate 1 with respect to a vertical direction and for regulating the position of the outside periphery of the substrate 1 with respect to a horizontal direction. Denoted at 3 is an upper plate (turn table) which is placed horizontally and on which the supporting pins 2 are mounted. Denoted at 4 is a lower plate which is disposed parallel to the upper plate 3. Denoted at 5 are a plurality of blades which are provided for forcible evacuation. Denoted at 6 is a rotational drive source and denoted at 7 is an air flowpassage duct. Denoted at 8 is an intake opening formed in a central portion of the upper plate 3. Arrows 9 show the direction of flow of air, and an arrow 10 shows the direction of rotation of the substrate 1, for example.

The blades 5 are disposed between the upper plate 3 and the lower plate 4, and they are placed at an angle with respect to the direction of the radius of the upper plate 3. More specifically, the angle is in a direction opposite to the rotational direction of the upper plate 3, as seen in FIG. 2. The air flowpassage 7 is formed circumferentially about the air blowing portion. This is formed integrally up to an air outlet port at its end, by means of a member having a C-shaped or channel-shaped section.

The upper plate 3, the lower plate 4 and the blades 5 are formed into an integral structure to provide an air blowing means, and they can be rotated coaxially by means of the rotational drive source 6. Air around the blades 5 is pushed into the air flowpassage 7 by means of the blades 5, and a negative pressure is created at the air intake opening 8. Thus, atmospheric pressure contact is produced at the top/bottom surface of the substrate 1 which is being held by the supporting pins 2 provided on the upper plate 3. Also, the pressure at the bottom surface side of the substrate becomes lower. As a result, the substrate 1 is pressed downwardly and it is stabilized on the substrate supporting pins. 2. In this manner, unwanted vibration of the substrate 1 during rotation and/or unwanted shift (horizontal displacement) between the substrate 1 and the substrate supporting pins 2 (resultant rubbing of the bottom surface of the substrate at the time of a change of the number of revolutions, is significantly reduced.

Figure 5:
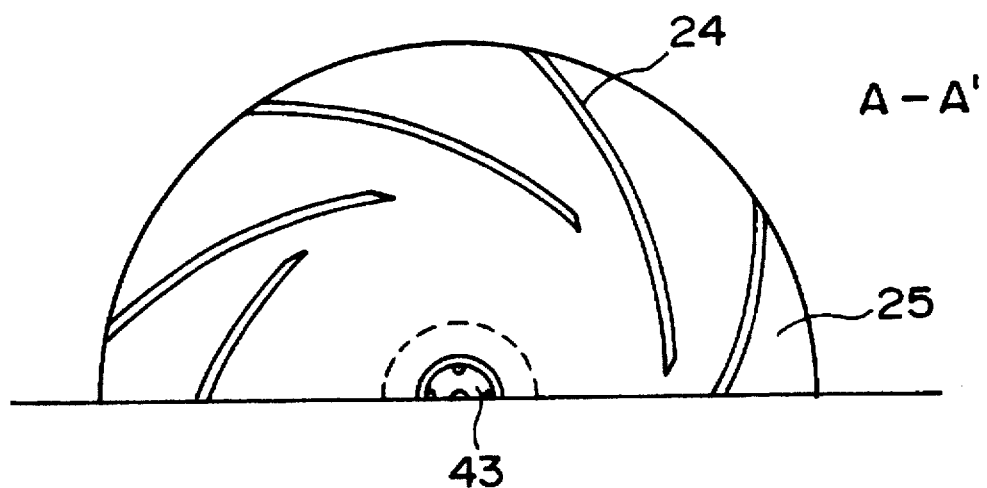
FIG. 5 is a sectional view taken along a line A-'A in FIG. 4, for explaining the fin structure of the rotatable stage.
Figure 6:
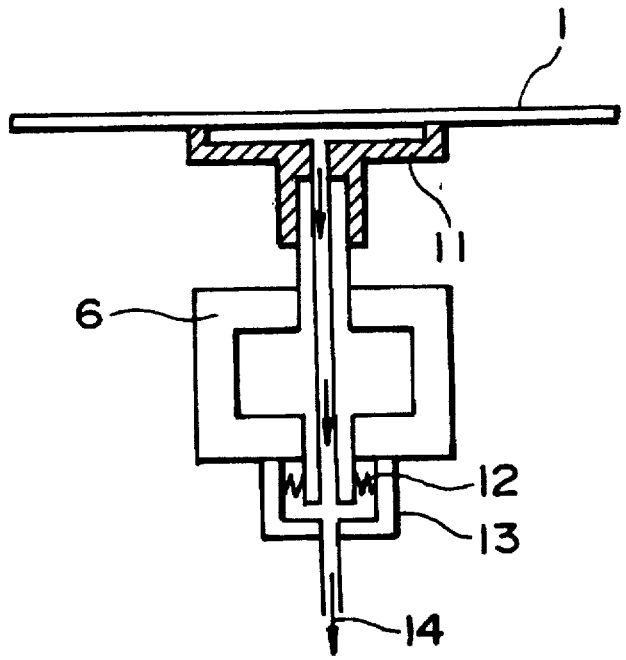
FIG. 6 is a longitudinal sectional view of a substrate rotating portion of a conventional vacuum attraction type substrate rotating device.
Figure 7:
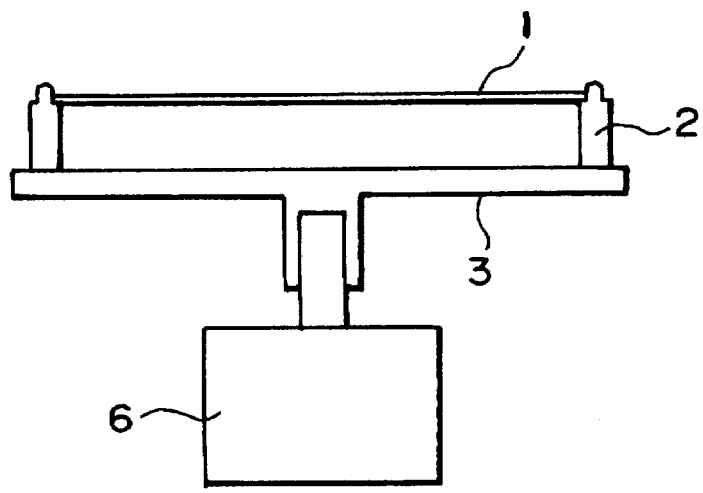
FIG. 7 is a longitudinal sectional view of a substrate rotating portion of a conventional pin supporting type substrate rotating device.
Figure 8:
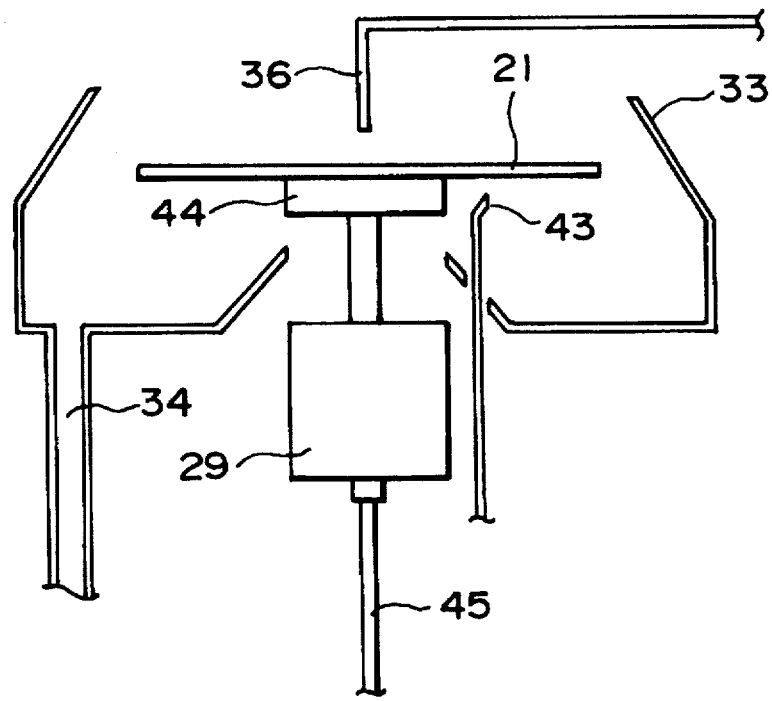
FIG. 8 is a longitudinal sectional view of a conventional substrate processing apparatus.

FIGS. 3 –5 show the structure of a substrate processing apparatus, according to a second embodiment of the present invention. FIG. 3 is a schematic and longitudinal sectional view of a general structure of the apparatus, FIG. 4 is a longitudinal sectional view of a main portion of the apparatus, and FIG. 5 is a sectional view taken on a line A–A' in FIG. 4.

In these drawings, denoted at 21 is a wafer, and denoted at 22 are holding pins for supporting the wafer 21 with respect to a vertical direction and for regulating the position of the outside periphery of the wafer 21 with respect to a horizontal direction. Denoted at 23 is an upper stage which is placed horizontally and on which the holding pins 22 are mounted. Denoted at 24 are a plurality of fins as best seen in FIG. 5, which have substantially the same function as that of the blades 5 of FIG. 1. Denoted at 25 is a lower stage, and denoted at 26 is a follower pulley. Denoted at 27 is a belt, and denoted at 28 is a drive pulley. Denoted at 29 is a motor, and denoted at 30 is a hollow shaft. Denoted at 31 is a bearing for rotatably supporting the shaft 30, and denoted at 32 is an air flowpassage duct. Denoted at 33 is a cup for receiving used liquid medium scattered from the wafer 1, and denoted at 34 is a drain pipe for flowing the liquid medium in the cup 33 outwardly. Denoted at 35 is an air discharging duct, and denoted at 36 is an upper nozzle. Denoted at 37 is a valve, and denoted at 38 is a pressurized container. Denoted at 39 is an $N_2$ pressurized pipe, and denoted at 40 is a rinse valve. Denoted at 41 is a rinse pressurized container, and denoted at 42 is a rinse $N_2$ pressurized pipe. Denoted at 43 is a lower nozzle (rinse nozzle) which extends through the throughbore of the shaft 30.

The wafer 21 is supported by the holding pins 12 mounted on the upper stage 23, and it is placed on the upper stage 23. During rotation of the wafer 21, the liquid medium for treatment thereof is discharged toward the center of rotation (at the shaft 30) of the wafer 21 from the pressurized container 38, under the opening/closing control of the valve 37. The upper stage 23, the fin 24, the lower stage 25 and the follower pulley 26 are all rotated as a unit by means of the motor 29 and through the intervention of the drive pulley 28 and the belt 27. During rotation, a negative pressure is created and maintained at the bottom surface of the wafer 21. Thus, the wafer is pressed downwardly and it is stabilized. Also, the bottom surface of the wafer 21 is cleaned by a rinse liquid medium discharged toward it from the lower nozzle 43 disposed opposed to the rotational center of the wafer 21, under the control of the rinse valve 40. The rinse liquid medium is discharged against the bottom surface of the wafer 21 from the lower nozzle 43, while being sprayed upwardly. Since the wafer 21 is being pressed downwardly by the negative pressure which is produced by forcible evacuation by rotation of the fin 24, the wafer does not float as a result of applied pressure of the liquid discharged against the bottom surface thereof. This negative pressure acts on the bottom surface of the wafer 21 through the opening formed in the central portion of the upper stage 23, Because of a small surface contact area, the temperature uniformness in the surface after discharging of the temperature controlled liquid medium, is less externally disturbed.

In a substrate rotating device according to the embodiment of the present invention as described above, the rotating mechanism is provided with a rotation air-intake structure as a mechanism for producing a negative pressure with rotation. Thus, in the rotation and treatment of a substrate wherein damage to or contamination of the bottom surface of the substrate is to be avoided, it provides the following advantageous effects:

(1) The substrate during high speed rotation is stabilized by the negative pressure, and vibration of the substrate during rotation is reduced.

(2) Shift of the substrate (rubbing of the bottom surface thereof) at the time of a change of the number of revolutions is reduced.

(3) Because of the addition of no movable element for the substrate holding, the reliability of the mechanism is good.

(4) Because of a simple structure, the cost is low.

On the other hand, in a substrate processing apparatus according to the embodiment of the present invention as described above, the rotation stage for holding the outside periphery of a substrate with holding pins has a fin structure. Also, it has a structure for enabling cleaning the whole bottom surface of the substrate. Thus, it provides the following advantageous effects:

(1) Because the wafer stabilization is assured by a negative pressure which is produced during the rotation, addition of a complicated holding mechanism to the rotating mechanism is not necessary.

(2) The wafer is kept stable even during the cleaning of the bottom surface thereof. The wafer does not float as a result of the discharging pressure. The cleaning liquid can be discharged with a certain pressure, and the cleaning effect is good.

(3) In a developing process in which a liquid medium is applied to the top surface of the wafer for development thereof, because of good temperature uniformness through the whole wafer surface, good development performance is assured.

While the invention has been described with reference to the structures disclosed herein, it is not confined to the details set forth and this application is intended to cover such modifications or changes as may come within the purposes of the improvements or the scope of the following claims.

What is claimed is:

1. A substrate rotating device, comprising:

a turn table placed horizontally;

a substrate supporting member provided on said turn table, for supporting a substrate with respect to a vertical direction and for regulating the position of the outside periphery of the substrate with respect to a horizontal direction;

driving means for causing rotation of said turn table;

an opening formed in said turn table; and evacuating means rotatable as a unit with said turn table, for forcibly evacuating a space between said turn table and the substrate through said opening, said evacuating means comprising blowing means having (i) lower plate disposed below said turn table and placed coaxially with and parallel to said turn table said lower late having a central shaft connected to said driving means, and (ii) a plurality of blades disposed between said turn table and said lower plate and placed at an angle with respect to a direction of a radius of said turn table, the angle being in a direction opposite to the rotational direction of said turn table, said plurality of blades coupling said turn table with said lower plate as a unit, said blowing means being rotatable integrally with said turn table and said lower plate as the central shaft is driven by said driving means and said evacuating means further comprising a channel-shaped member disposed circumferentially about said blowing means to provide a gas flowpassage and a gas outlet port at an end of said gas flowpassage.

2. A substrate processing apparatus, comprising:

a turn table placed horizontally;

a substrate supporting member provided on said turn table, for supporting a substrate with respect to a vertical direction and for regulating the position of the outside periphery of the substrate with respect to a horizontal direction;

driving means for causing rotation of said turn table;

a first nozzle for discharging a first liquid medium toward a center of a first surface of the substrate during rotation of said turn table and the substrate;

a second nozzle for discharging a second liquid toward a center of a second surface of the substrate during rotation of said turn table and the substrate;

an opening formed in said turn table; and evacuating means rotatable as a unit with said turn table, for forcibly evacuating a space between said turn table and the substrate through said opening, said evacuating means comprising blowing means having (i) a lower plate disposed below said turn table and placed coaxially with and parallel to said turn table, said lower plate having a central shaft connected to said driving means, and (ii) a plurality of blades disposed between said turn table and said lower plate and placed at an angle with respect to a direction of a radius of said turn table, the angle being in a direction opposite to the rotational direction of said turn table, said plurality of blades coupling said turn table with said lower plate as a unit said blowing means being rotatable integrally with said turn table and said lower plate as the central shaft is driven by said driving means, and said evacuating means further comprising a channel-shaped member disposed circumferentially about said blowing means to provide a gas flowpassage and a gas outlet port at an end of said gas flowpassage.

* * * * *

UNITED STATES PATENT AND TRADEMARK OFFICE
CERTIFICATE OF CORRECTION

PATENT NO. : 5,706,843      Page 1 of 3
DATED : January 13, 1998
INVENTOR(S) : MANABU MATSUO It is certified that error appears in the above-identified patent and that said Letters Patent is hereby corrected as shown below:

ON THE COVER PAGE:

Under "FOREIGN PATENT DOCUMENTS," item [56]

"239621    9/1990    Japan ....... 269/21"

should read

--2-39621   9/1990   Japan ....... 269/21--.

COLUMN 1:

line 15, "FIG" should read --FIG.--;
    line 18, "surface" should read --surface of--; and
    line 45, "adhesion" should read --(adhesion--.

COLUMN 3:

line 4, "of" should be deleted;
    line 9, "forcibly" should read --forcible--;
    line 50, "portion," should read --portion--; and
    line 52, "A-'A" should read --A-A'--.

UNITED STATES PATENT AND TRADEMARK OFFICE
CERTIFICATE OF CORRECTION

PATENT NO. : 5,706,843
DATED : January 13, 1998
INVENTOR(S) : MANABU MATSUO

It is certified that error appears in the above-identified patent and that said Letters Patent is hereby corrected as shown below:

COLUMN 4:

line 36, "pins." should read --pins--;
    line 39, "end" should read --and--;
    line 40, "substrate" should read --substrate)--; and
    line 43, "3 -5" should read --3-5--.

COLUMN 5:

line 33, "23," should read --23.--; and
    line 58, "the" should read --of the--.

COLUMN 6:

line 28, "lower" should read --a lower--;
    line 30, "table" should read --table,--; and
    line 40, "means" should read --means,--.

UNITED STATES PATENT AND TRADEMARK OFFICE
CERTIFICATE OF CORRECTION

PATENT NO. : 5,706,843 Page 3 of 3
DATED : January 13, 1998
INVENTOR(S) : MANABU MATSUO It is certified that error appears in the above-identified patent and that said Letters Patent is hereby corrected as shown below:

COLUMN 7:

line 6, "unit" should read --unit,--.

Signed and Sealed this

Twenty-eighth Day of July, 1998

Attest:

BRUCE LEHMAN

Attesting Officer

Commissioner of Patents and Trademarks